(12) United States Patent
Jia et al.

(10) Patent No.: US 6,476,413 B1
(45) Date of Patent: Nov. 5, 2002

(54) HIGH TEMPERATURE SUPERCONDUCTING JOSEPHSON JUNCTIONS AND SQUIDS

(75) Inventors: Quanxi Jia, Los Alamos, NM (US); Xin Di Wu, San Jose, CA (US); Steven R. Foltyn, Los Alamos, NM (US); David W. Reagor, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

(21) Appl. No.: 09/446,864

(22) PCT Filed: Oct. 18, 1996

(86) PCT No.: PCT/US96/16791

§ 371 (c)(1), (2), (4) Date: Apr. 24, 1998

(87) PCT Pub. No.: WO97/15955

PCT Pub. Date: May 1, 1997

Related U.S. Application Data

(60) Provisional application No. 60/005,824, filed on Oct. 24, 1995.

(51) Int. Cl.[7] ............................................. H01L 39/22
(52) U.S. Cl. ............................. 257/33; 257/31; 257/34; 438/2
(58) Field of Search ........................... 257/30–36; 438/2

(56) References Cited

U.S. PATENT DOCUMENTS

| 4,831,421 A | 5/1989 | Gallagher et al. | 257/34 |
| 5,134,117 A | 7/1992 | Dilorio et al. | 505/162 |
| 5,247,189 A | 9/1993 | Tanaka et al. | 505/329 |
| 5,304,538 A | * 4/1994 | Vasquez et al. | 505/190 |
| 5,399,547 A | * 3/1995 | Negm et al. | 505/430 |
| 5,696,392 A | * 12/1997 | Char et al. | 257/190 |

FOREIGN PATENT DOCUMENTS

| JP | 5-090653 A | * 4/1993 | 257/31 |

OTHER PUBLICATIONS

K. Char et al., "Study of Interface Resistances in Epitaxial $YBa_2Cu_3O_{7-x}$/barrier/$YBa_2Cu_3O_{7-x}$ junctions," Appl. Phys. Lett. vol. 63, No. 17, pp. 2420–2422, Oct. 25, 1993.

M. Schilling et al. "$YBa_2Cu_3O_7$ Direct Current–Superconducting Quantum Interference Devices with Artificial $PrBa_2Cu_3O_7$ Barriers Above 77 K," Appl. Phys. Lett., vol. 64, No. 19, pp. 2600–2602, May 9, 1994.

R.H. Koch et al., "Quantum Interference Devices Made From Superconducting Oxide Thin Films," Appl. Phys. Lett. vol. 51, No. 3, pp. 200–202, Jul. 20, 1987.

M. A. M. Gijs et al. "$YB_aCu_3O_{7-\delta}$—$Ag$—$Al_2O_{3t}$/$Pb$ Tunnel Junctions Based on the Superconducting Proximity Effect," Appl. Phys. Lett. vol. 57, No. 24, pp. 2600–2602, Dec. 10, 1990.

* cited by examiner

*Primary Examiner*—Nathan J. Flynn
*Assistant Examiner*—Scott R Wilson
(74) *Attorney, Agent, or Firm*—Bruce H. Cottrell

(57) ABSTRACT

A high temperature superconducting Josephson junction device with ramp-edge geometry in which silver is combined in a composite with $YBa_2Cu_3O_7$, yttrium-barium-copper-oxide, to form the electrodes, or $PrBa_2Cu_3O_7$, praseodymium-barium-copper-oxide, to form the weak link.

13 Claims, 5 Drawing Sheets

HIGH TEMPERATURE SUPERCONDUCTING JOSEPHSON JUNCTIONS AND SQUIDS

This application claims the benefit of provisional application No. 60/005,824, filed Oct. 24, 1995.

The present invention to superconductor Josephson junctions and dc superconducting quantum interference devices (SQUIDs) and to high temperature superconductor Josephson junctions and SQUIDs. This invention is the result of a contract with the United States Department of Energy (Contract No. W-7405-ENG-36).

BACKGROUND OF THE INVENTION

There are several junction configurations exhibiting Josephson effects. For example, Josephson junctions have previously been made on a bi-crystal substrate (see U.S. Pat. No. 5,278,140), but this technique generally requires an expensive substrate typically running as high as $400 per square centimeter. Another type of Josephson junction has a structure referred to as a vertical SNS wherein a substrate includes a superconductive (S) layer followed by a layer of a normal metal (N) of 20–30 Angstroms, followed by another layer of a superconductive (S) material. This type of structure suffers from construction problems since it is very difficult to grow a uniform, pinhole-flee, ultra-thin normal metal layer on high temperature superconductors. As a result, this type structure has seen little further development. Yet another type of Josephson junction has a structure referred to as a step edge S-N-S (see U.S. Pat. No. 5,367,178). The junction performance with this structure is very sensitive to the N-layer overlap with the S layer, step height, step slope, and deposition temperature for N-layer materials. Still another type of Josephson junction has a stepped structure with a superconductive layer over a stepped substrate relying on weak links at the turns or corners of the steps (referred to as a step-edge junction). Still another type of Josephson junction has a structure with a very narrow region formed by a beam damage process to create weak links in a weakened junction. Still another design for a Josephson junction (referred to as an edge-geometry or ramp-edge SNS) typically includes a substrate having a first superconductive layer deposited thereon and an insulator layer upon the superconductive (S) layer, both layers of the composite structure having a slanted (10–20 degrees) or ramp edge design. Then, a thin layer of a normal metal (N) is deposited over the prior composite structure and finally a second superconductive layer is deposited upon the normal metal layer.

Edge-geometry SNS structure provides several advantages compared to other junction technologies. The most important feature of the edge-geometry SNS store is that such a device can be put anywhere on a chip without affecting other devices. This feature is very important for the fabrication of complicated circuitry. Since this device can be patterned by a standard photolithography process, this planar device can be fabricated in a batch process. Also, the theoretical device performance depends on the N-layer thickness and resistivity. Furthermore, device performance is expected to be quite stable because of the lack of grain-boundary related problems.

Among the superconductive layers typically used in the various Josephson junction structures have been included, e.g., yttrium-barium-copper-oxide, gadolinium-barium-copper-oxide, bismuth-strontium-calcium-copper-oxide, and thallium-calcium-barium-copper-oxide. Among the normal metals typically employed in edge-geometry SNS junctions are included, e.g., calcium-ruthenium-oxide, strontium-ruthenium-oxide, ytrrium-praseodymium-barium-copper-oxide with the praseodymium serving as a dopant to change the electrical properties, calcium-doped ytrrium-barium-copper-oxide, cobalt-doped ytrrium-barium-copper-oxide, niobium-doped strontium-titanium-oxide, lanthanum-strontium-cobalt-oxide and lanthanum-strontium-copper-oxide.

Despite the extensive research to date on edge-geometry SNS Josephson junctions, problems remain in reproducibility and controllability of the junction performance. These problems stem from the superconductor material itself and also from the fabrication process. The interface between S/N or N/S has been recognized as the most important controlling factor in determining the performance of SNS junctions. The difficulty in controlling the interface comes from several aspects. The interface between S/N or N/S can be degraded due to the anisotropic properties of high-temperature superconductors, the mismatch in the lattice and thermal expansion coefficient between superconductor and N-layer, the chemical incompatibility between superconductor electrode and N-layer, the growth of the multilayer thin film on a ramp edge instead of on a flat surface around the active area of the device, the damage to the superconductor bottom electrode surface from ion-beam used to pattern the film, and the unavoidable grain-boundaries from the intrinsic island growth mechanism.

It is an object of the present invention to provide high performance Josephson junctions and SQUIDs solving the above mentioned problems. By engineering superconducting material in the fabrication of edge-geometry SNS Josephson junctions and SQUIDs, devices with reproducible and controllable properties have been fabricated.

It is a further object of the invention to develop functional high temperature superconductor thin films to fabricate related thin film devices (Josephson junctions, SQUIDs, microwave filters, transformers, and the like) with superior performance.

SUMMARY OF THE INVENTION

To achieve the foregoing and other objects, and in accordance with the purposes of the present invention, as embodied and broadly described herein, the present invention provides an edge-geometry SNS Josephson junction device including a substrate, a first electrode including yttrium-barium-copper oxide and silver upon the substrate, an insulating or highly resistive layer upon a portion of the first electrode, said first electrode and said insulating or highly resistive layer further characterized as having one side of this combination configured in a ramp edge shape, a layer of a normal metal or a layer that functions as a normal metal at operating temperatures of the device upon the ramp edge of the first electrode and the insulating material, and, a second electrode including yttrium-barium-copper oxide and silver upon the layer of normal metal. In another embodiment, the normal metal layer further includes silver.

The present invention further provides an edge-geometry SNS Josephson junction device including a substrate, a first electrode including yttrium-barium-copper oxide upon the substrate, an insulating or highly resistive layer upon a portion of the first electrode, said first electrode and said insulating or highly resistive layer further characterized as having one side of this combination configured in a ramp edge shape, a layer of a normal metal or a layer that functions as a normal metal at operating temperatures of the device upon the ramp edge of the first electrode and the insulating material, the normal metal layer including a portion of silver, and, a second electrode including yttrium-barium-copper oxide upon the layer of normal metal.

The present invention further provides a process for preparing a Josephson junction device including forming a first electrode including yttrium-barium-copper oxide and silver upon a substrate; depositing a layer of a material characterized as insulating or highly resistive at opting temperatures of the device, the material having chemical and structural compatibility with the first electrode to form an intermediate composite structure; depositing a photoresist material upon a portion of the intermediate composite structure; etching off selected areas of the intermediate composite structure; removing the photoresist material to yield an etched intermediate composite structure; depositing a layer of a normal metal or a layer that functions as a normal metal at operating temperatures of the device upon selected areas of the etched intermediate composite structure; and, depositing a second electrode including yttrium-barium-copper oxide and silver upon the layer of normal metal. In another embodiment, the normal metal layer further includes silver.

The present invention further provides a process for preparing a Josephson junction device including forming a first electrode including yttrium-barium-copper oxide upon a substrate; depositing a layer of a material characterized as insulating or highly resistive at operating temperatures of the device, the material having chemical and structural compatibility with the first electrode to form an intermediate composite structure; depositing a photoresist material upon a portion of the intermediate composite structure; etching off selected areas of the intermediate composite stricture; removing the photoresist material to yield an etched intermediate composite structure; depositing a layer of a normal metal or a layer that functions as a normal metal at operating temperatures of the device upon selected areas of the etched intermediate composite structure, the normal metal layer including a portion of silver, and, depositing a second electrode including yttrium-barium-copper oxide upon the layer of normal metal.

The present invention still further provides a general improvement for a high temperature superconducting Josephson junction device including two separated electrode portions of a superconductive material separated by a suitable weak link, the improvement being the use of a composite of yttrium-barium-copper oxide and silver as the superconductive materials.

The present invention still further provides a general improvement for a high temperature superconducting Josephson junction device including two separated electrode portions of a superconductive material separated by a suitable weak link, the improvement being the use of a composite of a normal metal and silver as the suitable weak link.

The present invention still further provides an improvement in a high temperature superconducting quantum interference device (SQUID) including two SNS Josephson junctions connected in parallel in a superconducting loop or in a high temperature superconducting quantum interference device (SQUID) including a SNS Josephson junction within a superconducting loop, the improvement being either the use of a composite of yttrium-barium-copper oxide and silver as the superconductive materials of the SNS Josephson junctions, the use of a composite of a normal letal and silver as the normal metal material, or both use of the silver-containing composites as the normal metal material and the superconductive materials of the SNS Josephson junction or junctions.

DETAILED DESCRIPTION

The present invention is concerned with high temperature superconductor Josephson junctions and SQUIDs including such junctions.

Figure 1:
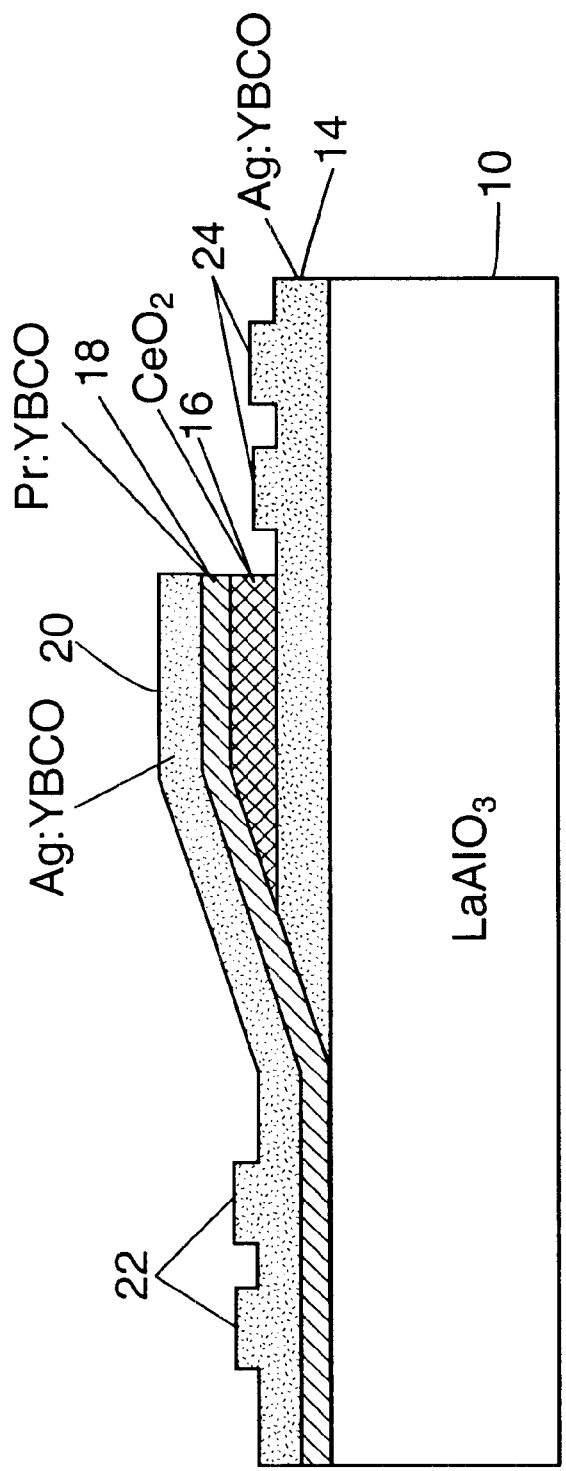
FIG. 1 is a cross sectional view of one embodiment of a Josephson junction in accordance with the present invention.

In one embodiment of the present invention, the Josephson junction has an edge-geometry superconductor/normal metal/superconductor (SNS) construction as shown in FIG. 1. The Josephson junction shown in FIG. 1 includes a base substrate 10, a first layer of a superconductive oxide material 14 as an electrode, with a layer of insulating or highly resistive material 16 partially thereon the superconductive oxide material. After suitable etching during the preparation of the junction, a layer of a normal metal 18 is deposited upon the top surfaces and a second layer of a superconductive oxide material 20 as a second or top electrode is deposited thereover. Electrode contacts 22 and 24 complete the junction device.

The base substrate can generally be of any material that is chemically and structurally compatible with the superconductor material deposited thereon. Optionally, intermediate layers or buffer layers can be interposed between the substrate and the superconductor to provide chemical and structural compatibility. Among suitable substrates are included lanthanum aluminum oxide, neodynium gadolinium oxide, magnesium oxide, strontium titanium oxide, yttria-stabilized zirconia (YSZ), cerium oxide-buffered sapphire, or YSZ- or cerium oxide/YSZ-buffered silicon.

As the superconductive oxide electrode materials of the Josephson junction, a silver containing yttrium-barium-copper oxide is employed.

Deposition of the superconducting thin films can be done by pulsed laser deposition, sputtering, e-beam evaporation, molecular beam epitaxy and the like. The silver/YBCO composite can be formed by simply mixing silver into the target of superconducting materials such as yttrium-barium-copper oxide using pure silver and/or silver oxide. Another manner of forming a silver/YBCO composite as the electrode film can be by co-evaporation or co-pulsed laser deposition or co-sputtering using separate targets of silver and superconducting materials or by ion-implantation of silver into the superconductor.

The insulating material in the SNS configuration can be any non-conductive material having chemical and structural compatibility with the superconductive oxide material and the normal metal material of the junction. Highly resistive materials can also be used as an isolating layer between the top and bottom (first and second) superconductive electrodes. Among the suitable insulating materials are cerium oxide, lanthanum aluminum oxide, magnesium oxide, strontium titanium oxide, yttrium oxide, aluminum oxide and praseodynium-barium-copper oxide.

During fabrication of the edge-geometry SNS junction, the deposition of the first superconductive oxide material electrode and the insulating or highly resistive material thereon forms an intermediate composite structure. An etching step then follows. A photoresist material is then deposited by, e.g., coating over the area of this intermediate composite structure prior to the subsequent etching step. The photoresist material serves to protect those areas that are to remain after etching. Numerous photoresist materials are suitable including, e.g., AZ5214™ available from Hoechst Celenese Corporation. After the etching step, the remaining photoresist is removed, e.g., by dissolution with acetone, to leave an etched intermediate composite structure.

After the photoresist material is applied to the desired areas, conventional photolithography and ion milling (other dry or wet etching techniques may also be used) can be used to form the edge in the desired angle. Generally, the resultant angle in the structure after milling is from about 10° to about 80°, preferably from about 5° to about 20° although any other angle may be used as desired.

The normal metal layer or the layer that functions as a normal metal metal at operating temperatures of the device is deposited upon the intermediate article remaining after removal of the photoresist. Suitable materials as the normal metal can include praseodymium-barium-copper oxide and may also include a composite of such normal metals with a portion of silver.

The operating temperature of these high temperature superconducting quantum interference devices is generally at or below the boiling point of liquid nitrogen.

In another embodiment of the present invention, the superconductive oxide electrode material, i.e., a silver containing yttrium-barium-copper oxide is employed in other junction geometries such as bi-crystal junctions, step-edge junctions, and vertical or planar step-edge SNS junctions. Thus, one embodiment of the present invention is the use of a superconductive oxide material of silver and yttrium-barium-copper oxide as electrode portions of a junction device, such electrode portions separated by a suitable weak link, introduced either purposely or naturally.

The present invention is more particularly described in the following example which is intended as illustrative only, since numerous modifications and variations will be apparent to those skilled in the art.

EXAMPLE

To fabricate SQUIDs with an edge-geometry SNS device configuration, a pulsed laser deposition (PLD) technique was used to deposit both top and bottom Ag:yttrium-barium-copper oxide (YBCO) electrodes, an N-layer of praseodynium-barium-copper oxide (PBCO), and an insulating layer of cerium oxide ($CeO_2$). A Ag-containing YBCO target was a 5 weight percent Ag-containing $YBa_2Cu_3O_{7-x}$ pellet, while the atomic ratio of Ag in the film was found to be Ag:Y=1:10 based on Rutherford backscattering spectrometry (RBS) analysis. The in situ deposition used a 308 nm XeCl excimer laser operating at a repetition rate of 20 Hz and producing 20 ns pulses with an energy density of 2 $J/cm^2$. Initially, a bilayer of superconductor of about 300 nm ±20 nm thickness and insulator of about 300 nm ±20 nm in thickness was deposited on a 1×1 $cm^2$ $LaAlO_3$ substrate. The depositions were done at a temperature of 775° C. and an oxygen pressure of 200 mTorr for Ag:YBCO, but at 650° C. for the $CeO_2$ layer, respectively.

Conventional photolithography was used to define the device geometry and location and ion milling with 250 eV Ar ions was used to etch the film and to form the edge. The orientation of the ion beam was fixed at 60° from normal into the edge during ion milling. The angle between the edge and the substrate surface, as measured by atomic force microscopy, was in the range of 15°±3°. It was necessary to postbake the photoresist (AZ5214™ from Hoechst Celenese Corporation) at 170° C. for 1 minute after developing in order to form such a shallow angle by using ion milling to etch the edge. The N-layer PBCO and the top Ag:YBCO electrode were deposited after stripping off the photoresist and cleaning the edge surface. The substrate temperature and oxygen pressure during both N-layer and top Ag:YBCO electrode deposition were the same as used for the deposition of bottom Ag:YBCO electrode.

Figure 2:
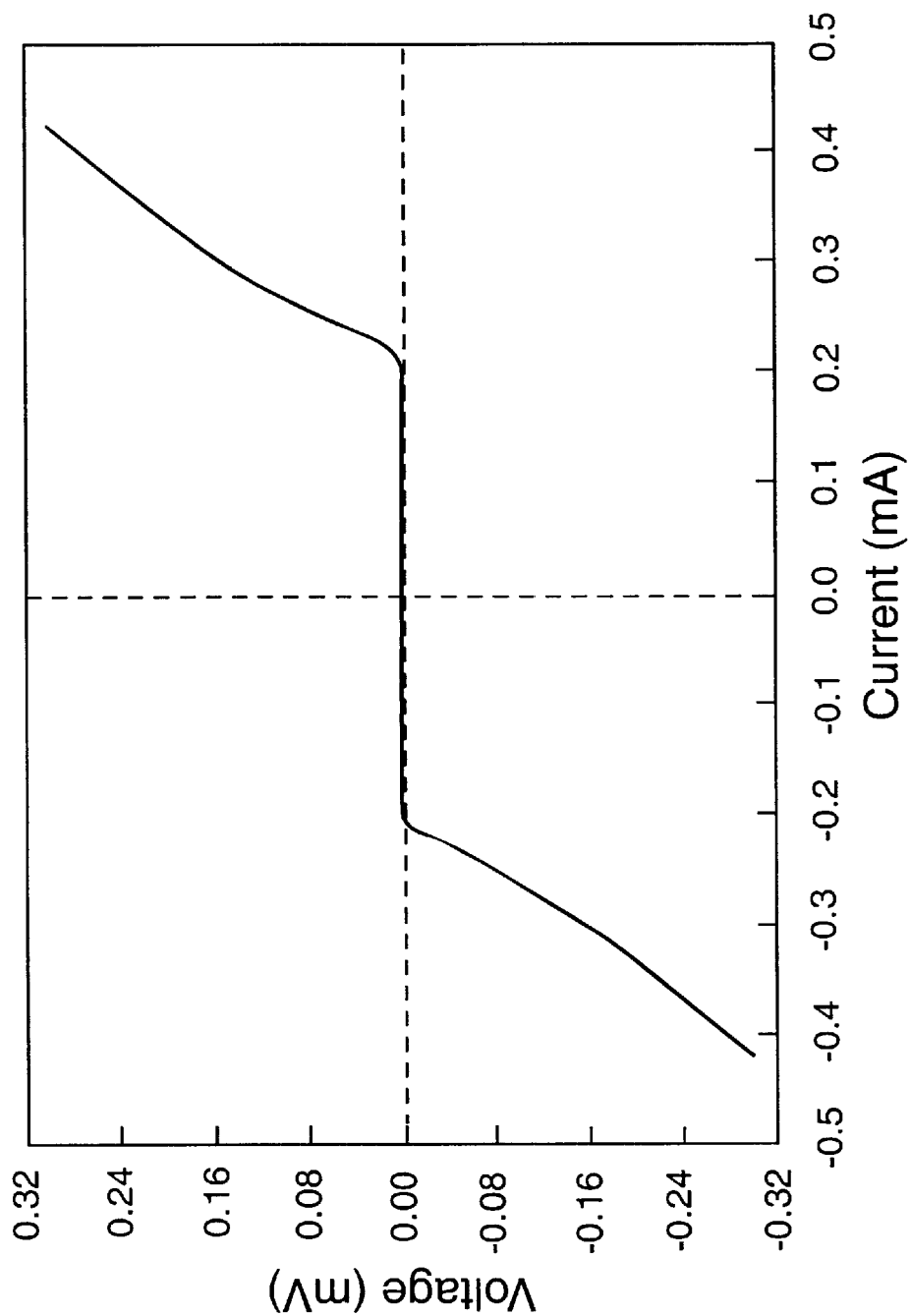
FIG. 2 is a graph illustrating typical current versus voltage characteristics under dc bias of a SNS junction with a 20 $\mu$m wide bridge operated at 75 K.

Edge-geometry SNS junctions fabricated using silver-containing $YBa_2Cu_3O_{7-x}$ composites as electrodes showed resistively shunted junction (RSJ) current vs. voltage characteristic under dc bias at an operating temperature of 75 K. FIG. 2 shows the experimental results, where the bridge width was 20 $\mu$m. The product of the critical current and the junction resistance was above 200 $\mu$V.

Figure 3:
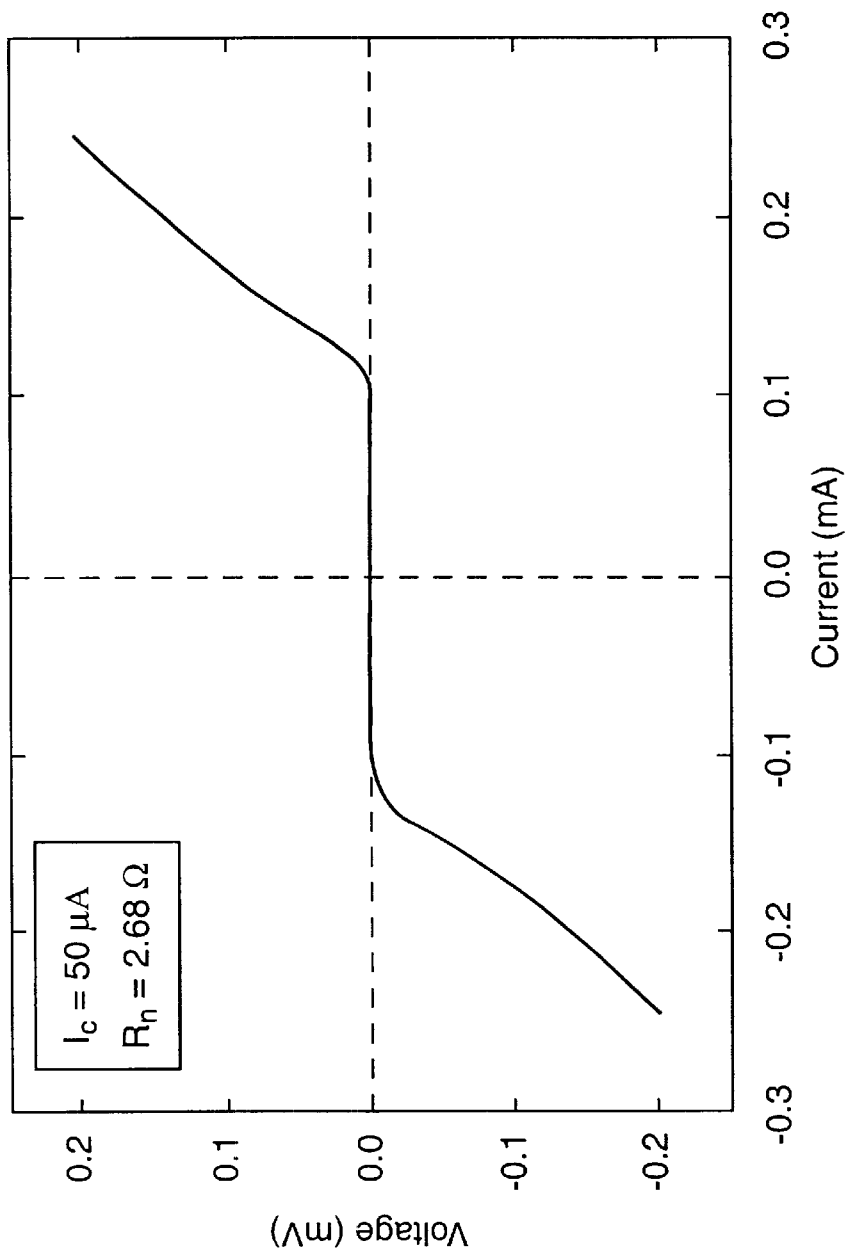
FIG. 3 is a graph illustrating typical current plotted versus voltage characteristic of a dc SQUID with a 5 $\mu$m wide bridge and a 27 nm thick praseodymium-barium-copper oxide barrier layer operated at 75 K.

The SQUIDs, having a proper N-layer thickness fabricated in this manner, show resistively shunted junction (RSJ) characteristics under dc bias at liquid nitrogen temperature. FIG. 3 shows the typical current versus voltage characteristic of a dc SQUID (5 $\mu$m wide bridge for each junction) with a 27 nm PBCO barrier at 75 K. The critical current ($I_c$) and junction resistance ($R_n$) for each junction are 50 $\mu$A and 2.68 $\Omega$, respectively. An average specific junction resistivity (defined as the product of $R_n$ and bridge width) of around 13 $\Omega \cdot \mu$m has been achieved for bridge widths from 2 $\mu$m to 20 $\mu$m at 75 K. The typical $I_cR_n$ value of the SQUIDs is in the range of 120–140 $\mu$V at 75 K and these values have been found to scale fairly well with device geometry.

The measured $R_n$ value from the junction is also consistent with that calculated from the PBCO barrier layer. The resistivity of PBCO with a thickness in the range of 20–40 nm is $5.7 \times 10^{-2}$ $\Omega \cdot$cm at 75 K. The specific interface resistance, calculated by comparing the experimentally determined junction resistance with that theoretically evaluated from the device geometry, is around $10^{-10}$ $\Omega \cdot cm^2$. This implies that the interface resistance is not a controlling factor of the device performance. In fact, a measured critical current density of 3–4×10$^6$ $A/cm^2$ at 75 K across SS junctions by using a AG:YBCO material as the electrodes, compared with a value of 1–2×10$^6$ $A/cm^2$ obtained with YBCO electrodes, indicates the improvement of both the film and interface quality by using a silver/YBCO composite as the superconductor electrodes.

Figure 4:
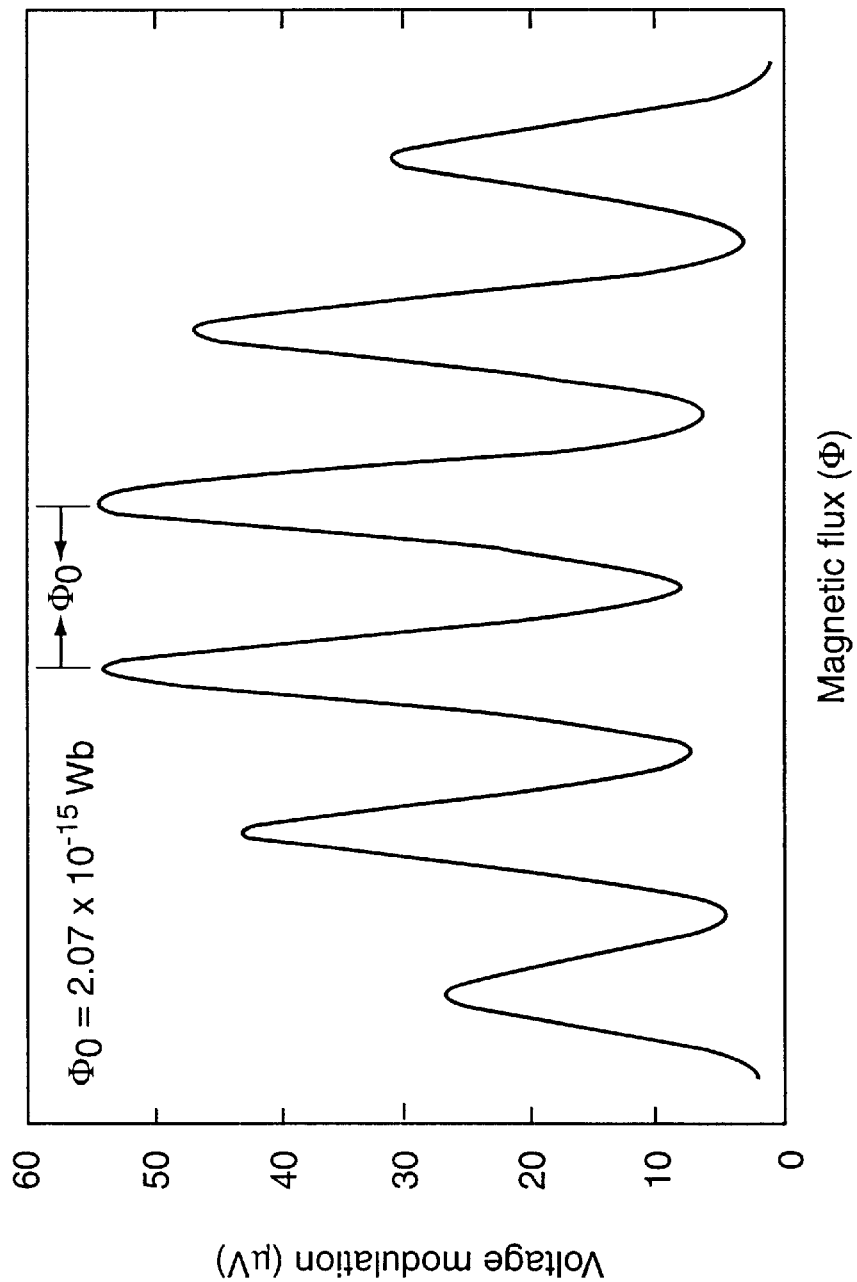
FIG. 4 is a graph illustrating SQUID voltage modulation plotted versus magnetic flux operated at 75 K, where the peak-to-peak voltage modulation is 49 $\mu$V.
Figure 5:
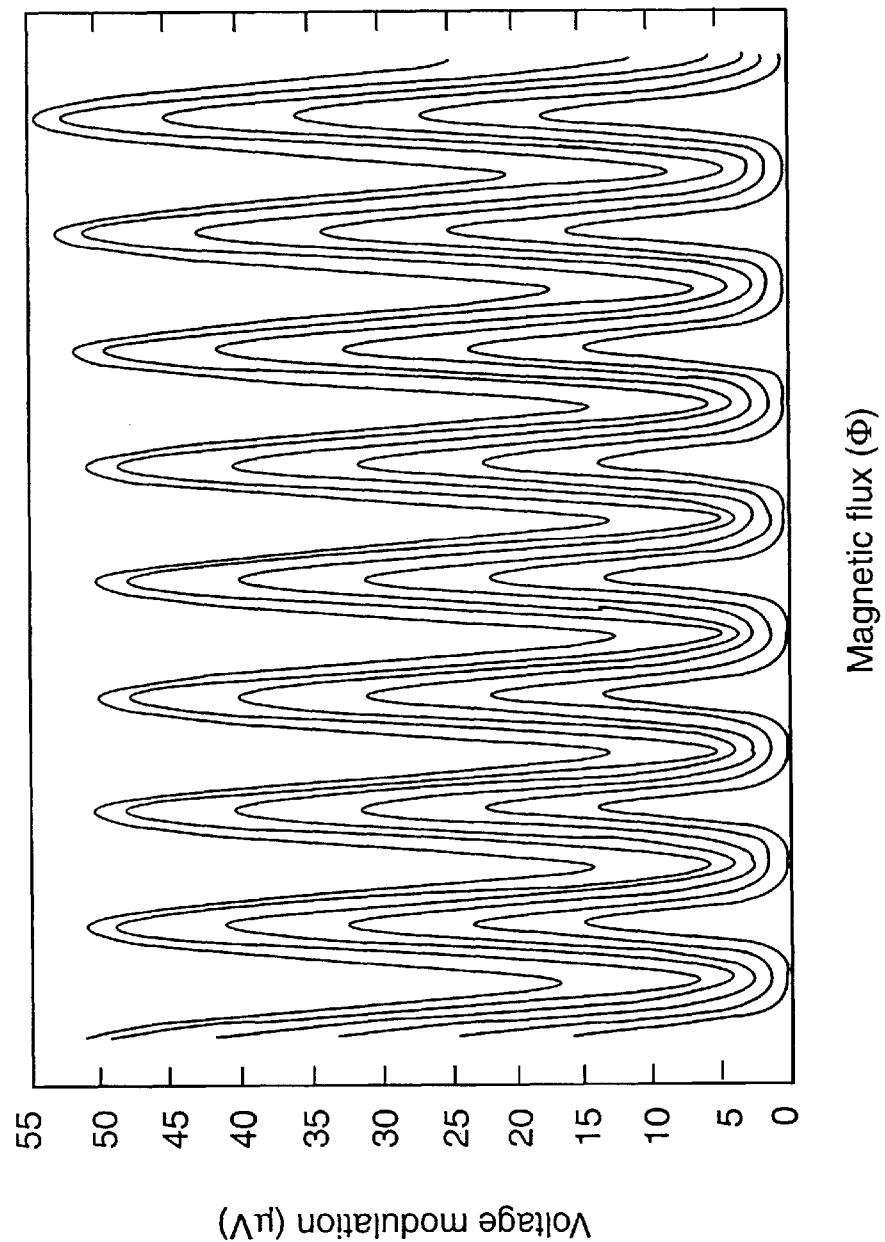
FIG. 5 is a graph illustrating voltage modulation plotted versus magnetic flux for a dc SQUID operated at 75 K with different bias currents.

Many SQUIDs fabricated on the same chip or different chips from different runs show voltage modulation above 25 $\mu$V at 75 K The yield of the devices, in terms of voltage modulation by magnetic field, is quite high: 11 of 12 SQUIDs on a typical 1×1 $cm^2$ chip exhibited voltage modulation at 75 K. One of the SQUIDs on the chip was open due to a defect introduced during processing. Table 1 presents more data for devices with different geometries. All of the SQUIDs have a square center hole with dimensions of either 5×5 $\mu m^2$ or 10×10 $\mu m^2$. The bridge width was varied from a 2 $\mu$m to 10 $\mu$m. It should be pointed out that the SQUID layout has not yet been optimized While doing field tests on the SQUID, the field is applied normal to the surface. The highest voltage modulation achieved was 49 $\mu$V at 75 K; the SQUID voltage modulation is shown in FIG. 4. FIG. 5 shows the voltage modulation vs magnetic flux ($\Phi$) with different bias currents at 75 K from another SQUID. The curves are perfectly periodic and show no hysteresis while sweeping $\Phi$ back and forth. No correlation has been found between voltage modulation and the size of the square hole in the SQUID. Regardless of whether the hole size is 5×5 $\mu m^2$ or 10×10 $\mu m^2$, the modulation depth is near optimum.

TABLE 1

High-temperature superconductor dc SQUIDs fabricated with an edge-geometry SNS configuration using Ag:YBCO as electrodes and PBCO as N-layer operated at 75 K

| SQUID | Bridge Width ($\mu m$) | Hole Size ($\mu m \times \mu m$) | Voltage modulation ($\mu V$) |
|---|---|---|---|
| 1 | 2 | 5 × 5 | 32 |
| 2 | 5 | 5 × 5 | 40 |
| 3 | 5 | 10 × 10 | 45 |
| 4 | 10 | 5 × 5 | 49 |

The relatively high flux-to-voltage transfer function ($\partial v/\partial \Phi$) of the SQUID, which was over 150 $\mu V/\Phi_0$ ($\Phi_0 = 2.07 \times 10^{-15}$ Wb is the flux quantum), makes the device fairly quiet. Preliminary noise tests on the SQUID, performed with dc bias at 75 K without any noise reduction scheme, gave a root mean square flux noise of 30–40 $\mu\Phi_0 Hz^{-1/2}$ at 1 HZ.

In summary, high performance superconductor Josephson junctions and dc SQUIDs have been successfully fabricated using Ag:YBCO as electrodes with an edge-geometry SNS configuration. The devices routinely display $I_c R_n$ products over 120 $\mu V$, $\partial v/\partial \Phi$ of over 100 $\mu V/\Phi_0$, and noise below 100 $\mu\Phi_0 Hz^{-1/2}$ at 1 Hz at 75 K. While not wishing to be bound by the present explanation, the improved device performance, based on preliminary microstructural analysis of the material and evaluation of electrical properties of the thin film, is believed to be from the well controlled interface between the superconductor and N-layer material obtained by using a Ag:YBCO material as the electrodes.

Although the present invention has been described with reference to specific details, it is not intended that such details should be regarded as limitations upon the scope of the invention, except as and to the extent that they are included in the accompanying claims.

What is claimed is:

1. An edge-geometry SNS Josephson junction device comprising:
   a substrate;
   a first electrode including yttrium-barium-copper oxide upon said substrate;
   an insulating layer or highly resistive layer upon a portion of said first electrode, said first electrode and said insulating or highly resistive layer further characterized as having one side of this combination configured in a ramp edge shape;
   a layer of praseodymium-barium-copper oxide and silver upon the ramp edge of said first electrode and said insulating or highly resistive material, and,
   a second electrode including yttrium-barium-copper oxide upon the layer of praseodymium-barium-copper oxide and silver.

2. The Josephson junction device of claim 1 wherein said insulating layer is of cerium oxide.

3. In a high temperature superconducting Josephson junction device including two separated electrode portions of a superconductive material separated by a suitable weak link, the improvement comprising using a composite including a praseodymium-barium-copper oxide and silver as said suitable weak link.

4. A process for preparing a Josephson junction device comprising:
   forming a first electrode including yttrium-barium-copper oxide and silver upon a substrate;
   depositing a layer of a material characterized as insulating or highly resistive at operating temperatures of said device, said material having chemical and structural compatibility with the first electrode to form an intermediate composite structure;
   depositing a photoresist material upon a portion of said intermediate composite structure;
   etching off selected areas of said intermediate composite structure;
   removing said photoresist material to yield an etched intermediate composite structure;
   depositing a layer of a normal metal or a layer that functions as a normal metal at operating temperatures of the device upon selected areas of said etched intermediate composite strut; and,
   depositing a second electrode including yttrium-barium-copper oxide and silver upon the layer of normal metal.

5. The process of claim 4 wherein said normal metal layer is of praseodymium-barium-copper oxide.

6. The process of claim 4 wherein said insulating layer is of cerium oxide.

7. A process for preparing a Josephson junction device comprising:
   forming a first electrode including yttrium-barium-copper oxide upon a substrate;
   depositing a layer of a material characterized as insulating or highly resistive at operating temperatures of said device, said material having chemical and structural compatibility with the first electrode to form an intermediate composite structure;
   depositing a photoresist material upon a portion of said intermediate composite structure;
   etching off selected areas of said intermediate composite structure;
   removing said photoresist material to yield an etched intermediate composite structure;
   depositing a layer of a normal metal or a layer that functions as a normal metal at operating temperatures of the device upon selected areas of said etched intermediate composite structure, said normal metal layer including a portion of silver; and,
   depositing a second electrode including yttrium-barium-copper oxide upon the layer of normal metal.

8. The process of claim 7 wherein said normal metal layer is of praseodymium-barium-copper oxide.

9. The process of claim 7 wherein said insulating layer is of cerium oxide.

10. A superconducting quantum interference device or SQUID including two SNS Josephson junctions connected in parallel in a superconducting loop, said SNS Josephson junctions having an edge-geometry and each comprising:
   a substrate;
   a first electrode including yttrium-barium-copper oxide and silver upon said substrate;
   an insulating layer or highly resistive layer upon a portion of said first electrode, said first electrode and said insulating or highly resistive layer further characterized as having one side of this combination configured in a ramp edge shape;
   a layer of a normal metal or a layer that functions as a normal metal at operating temperatures of the device upon the ramp edge of said first electrode and said insulating or highly resistive material; and, a second electrode including yttrium-barium-copper oxide and silver upon the layer of normal metal wherein said device is further characterized as having a voltage modulation of greater than about 45 $\mu$V at 75K and a flux-to-voltage transfer function of greater than about 150 $\mu$V/$\Phi_0$.

11. A superconducting quantum interference device or SQUID including two SNS Josephson junctions connected in parallel in a superconducting loop, said SNS Josephson junctions having an edge-geometry and each comprising:

a substrate;

a first electrode including yttrium-barium-copper oxide and silver upon said substrate;

a layer of cerium oxide upon a portion of said first electrode, said first electrode and said cerium oxide layer further characterized as having one side of this combination configured in a ramp edge shape;

a layer of a normal metal or a layer that functions as a normal metal at operating temperatures of the device upon the ramp edge of said first electrode and said cerium oxide layer; and, a second electrode including yttrium-barium-copper oxide and silver upon the layer of normal metal wherein said device is further characterized as having a voltage modulation of greater than about 45 $\mu$V at 75K and a flux-to-voltage transfer function of greater than about 150 $\mu$V/$\Phi_0$.

12. A superconducting quantum interference device or SQUID including a SNS Josephson junction within a superconducting loop, said SNS Josephson junction having an edge-geometry and comprising:

a substrate;

a first electrode including yttrium-barium-copper oxide upon said substrate;

an insulating layer or highly resistive layer upon a portion of said first electrode, said first electrode and said insulating or highly resistive layer further characterized as having one side of this combination configured in a ramp edge shape;

a layer of praseodymium-barium-copper oxide and silver upon the ramp edge of said first electrode and said insulating or highly resistive material, said normal metal layer including a portion of silver; and, a second electrode including yttrium-barium-copper oxide upon the layer of normal metal.

13. The device of claim 12 wherein said insulating layer is of cerium oxide.

* * * * *